(12) United States Patent
Ellison et al.

(10) Patent No.: US 8,492,772 B2
(45) Date of Patent: Jul. 23, 2013

(54) HOMOEPITAXIAL GROWTH OF SIC ON LOW OFF-AXIS SIC WAFERS

(75) Inventors: Alexandre Ellison, Linköping (SE); Christer Hallin, Linköping (SE); Björn Magnusson, Linköping (SE); Peder Bergman, Linköping (SE)

(73) Assignee: Norstel AB, Linköping (SE)

( * ) Notice: Subject to any disclaimer, the term of this patent is extended or adjusted under 35 U.S.C. 154(b) by 393 days.

(21) Appl. No.: 12/402,551

(22) Filed: Mar. 12, 2009

(65) Prior Publication Data
US 2009/0230406 A1    Sep. 17, 2009

Related U.S. Application Data

(63) Continuation of application No. 11/180,611, filed on Jul. 14, 2005, now Pat. No. 7,531,433.

(60) Provisional application No. 60/588,806, filed on Jul. 19, 2004.

(51) Int. Cl.
*H01L 29/15* (2006.01)

(52) U.S. Cl.
USPC ............ 257/77; 257/E29.104; 257/E29.109

(58) Field of Classification Search
USPC ................ 257/777, E29.104, 77, E29.109
See application file for complete search history.

(56) References Cited

U.S. PATENT DOCUMENTS

| | | | |
|---|---|---|---|
| 4,912,064 A | 3/1990 | Kong et al. | |
| 5,011,549 A | 4/1991 | Kong et al. | |
| 5,248,385 A | 9/1993 | Powell | |
| 5,915,194 A | 6/1999 | Powell et al. | |
| 6,329,088 B1 | 12/2001 | Landini et al. | |
| 6,641,938 B2 | 11/2003 | Landini et al. | |
| 6,900,477 B1 | 5/2005 | Shah | |
| 2003/0080842 A1 | 5/2003 | Sumakeris et al. | |
| 2004/0051136 A1 | 3/2004 | Kataoka et al. | |
| 2005/0077591 A1 | 4/2005 | Fukuda et al. | |

FOREIGN PATENT DOCUMENTS

| | | |
|---|---|---|
| JP | 2003282451 A | 10/2003 |
| WO | WO 92/22922 | 12/1992 |

OTHER PUBLICATIONS

M. Skowronski,, J.Q. Liu, W.M. Vetter, M. Dudley, C. Hallin and H. Lendenmann; Recombination-enhanced Defect Motion in Forward-biased 4H-SiC *p-n* Diodes; Journal of Applied Physics; Oct. 15, 2002; pp. 4699-4704; vol. 92, No. 8.

H. Lendenmann, F. Hahlquist, J.P. Bergman, H. Bleichner and C. Hallin; High-Power SiC Diodes: Characteristics, Reliability and Relation to Material Defects; Materials Science Forum; 2002; pp. 1259-1264; vols. 389-393; Trans Tech Publications; Switzerland.

(Continued)

*Primary Examiner* — Matthew Reames
(74) *Attorney, Agent, or Firm* — Venable LLP; Eric J. Franklin

(57) ABSTRACT

A wafer including a SiC substrate having a surface that is inclined relative to a (0001) basal plane at an angle higher than 0.1 degree but less than 1 degree, a SiC homoepitaxial device layer, and a SiC homoepitaxial boundary layer having a thickness up to 1 μm arranged between the substrate and the device layer. The boundary layer has been grown on the substrate under an atmosphere of lower supersaturation than when forming the device layer and at a C/Si ratio above 1.

12 Claims, 5 Drawing Sheets
(3 of 5 Drawing Sheet(s) Filed in Color)

OTHER PUBLICATIONS

K. Kojima, H. Okumura, S. Kuroda and K. Arai; Homoepitaxial Growth of 4H-SiC on on-axis (0 0 0 $\bar{1}$) C-face Substrates by Chemical Vapor Deposition; Journal of Crystal Growth 269; 2004; pp. 367-376.

K. Kojima, T. Takahashi, Y. Ishida, S. Kuroda, H. Okumura and K. Arai; 4H-SiC Carbon-Face Epitaxial Layers Grown by Low-Pressure Hot-Wall Chemical Vapor Deposition; Materials Science Forum; 2004; pp. 209-212; vols. 457-460; Trans Tech Publications; Switzerland.

M. Treu, R. Rupp, H. Brunner, F. Dahlquist and CH. Hecht; Challenges and First Results of SiC Schottky Diode manufacturing using a 3 inch Technology; Materials Science Forum; 2004; pp. 981-984; vols. 457-460; Trans Tech Publications; Switzerland.

C. Hallin, Q. Wahab, I. Ivanov, P. Bergman and E. Janzén; Homoepitaxial on-axis growth of 4H-and 6H-SiC by CVD; Materials Science Forum; 2004; pp. 193-196; vols. 457-460; Trans Tech Publications; Switzerland.

Search Report issued by European Patent Office in EP 05014753.7—Nov. 25, 2008.

Kimoto et al., Abstract—ICSCRM '99: the International Conference on Silicon Carbide and Related Materials, Oct. 10, 1999 to Oct. 15, 1999.

A. Fissel, High Quality SiC epitaxial layers and low-dimensional heteropolytypic SiC structures grown by solid-source MBE, Journal of Crystal Growth, 227-228 (2001).

S. Nakamura et al., Homoepitaxy of 6 H-SiC on Nearly on-axis (0001) Faces by Chemical Vapor Deposition Part I: Effect of C/Si Ration on Wide-area Homoepitaxy Without 3C-SiC Inclusions; *Journal of Crystal Growth* 256; 2003; pp. 341-346.

S-I Nakamura, et al., Wide-Area Homoepitaxial growth of 6H-SiC on Nearly On-Axis (0001) by Chemical vapor Deposition; *Materials Science Forum*; 2003; pp. 149-152, Vols. 433-436; Trans Tech Publications; Switzerland.

S. Ha et al., Dislocation Conversion in 4H Silicon Carbide Epitaxy; *Journal of Crystal Growth* 244, 2002; pp. 257-266.

S-I Nakamura et al., Surface Mechanisms in Homoepitaxial Growth on α-SiC (001)—vicinal Faces; Silicon Carbide and Related Materials; *Materials Science Forum*; 2003; pp. 163-168.

Rupp et al. "Epitaxial growth of SiC in a single and multi wafer vertical CVD system: a comparison," Materials Science and Engineering 62, 125-129, 1999.

Zhang et al., Electrically active defects in *n*-type 4H-silicon carbide grown in a vertical hot-wall reactor, Journal of Applied Physics, vol. 93, No. 8, Apr. 15, 2003.

Office Action issued by the Japanese Patent Office in connection with counterpart Japanese Patent Application No. 2005-208524, 2010.

Fissel, A., High-quality SiC epitaxial layers and low-dimensional heteropolytypic SiC structures grown by solid-source MBE, *Journal of Crystal Growth* 227-228 (2001) 805-810.

# HOMOEPITAXIAL GROWTH OF SIC ON LOW OFF-AXIS SIC WAFERS

CROSS-REFERENCE TO RELATED APPLICATIONS

This application is a continuation of co-pending U.S. patent application Ser. No. 11/180,611 filed Jul. 14, 2005 now U.S. Pat. No. 7,531,433, which claims priority to U.S. provisional patent application 60/588,806 filed Jul. 19, 2004.

FIELD OF THE INVENTION

The present invention relates to epitaxial layers grown on SiC substrates having an off-axis angle less than 1 degree. Particularly, the invention is related to a method for accomplishing wafers and devices on SiC substrates having said off-axis angle.

BACKGROUND

Silicon carbide (SiC) electronic devices offer significant performance and energy saving advantages over silicon or gallium arsenide based devices due to the high electrical breakdown field (10 times higher than in Si) and high thermal conductivity (as high as copper) of SiC.

Except for optoelectronic applications such as LEDs, a wide spread use of SiC based devices in power conversion, high frequency and other applications is dependent on the availability of SiC epitaxied wafers combining a low density of defects and a manufacturing cost competitive with the alternative material, device or system solutions. For example, the cost structure of processed and packaged discrete SiC devices designed for PCs power supplies is today significantly affected by the substrate and epi material cost.

Because existing epitaxial growth technologies have been optimised for large off-axis (typically 8° or 4° for 4H—SiC) substrates to ensure the replication of the substrate's polytype into the epilayer by the use of the high density of atomic steps created by the high off-axis angle, the crystal growth material cost is increased by a material loss occurring when on-axis grown ingots are sliced into off-axis substrates. Furthermore, high off-axis substrates have, for geometrically reasons, a high density of basal plane dislocations intersecting the surface where epitaxial growth will be made. Also, with increasing off-axis angle, the anisotropy of the electrical field experienced by a device increases.

PRIOR ART

U.S. Pat. Nos. 4,912,064 and 5,011,549 teach a CVD method for producing device quality SiC films of hexagonal polytypes on substrates with an off-axis angle larger than 1 degree, and preferably between 3 and 12°, along one of the <11$\bar{2}$0> crystallographic directions.

U.S. Pat. Nos. 6,329,088 and 6,641,938 teach the use of SiC substrates having an off-axis from about 2 to 10 degrees, and preferably 7 to 9 degrees towards one to the six equivalent <1$\bar{1}$00> directions.

U.S. Pat. No. 5,248,385 teaches a method to homoepitaxially grow SiC films on SiC substrates having an off-axis angle from less than 0.1° to about 6° where the surface of the substrate is subject to a HCl/H2 gas mixture pre-growth etch to eliminate surface features which can act as nucleation sites for foreign polytype inclusions.

To designate the orientation, polytype and growth face of SiC substrates, the following notation will be used in this document: off-axis 4° 4H—SiC $(0001)_{Si}$ designates a 4H polytype SiC substrate with a Si growth surface inclined about 4° from the (0001) basal plane.

Nakamura et al. [1] teaches that homoepitaxial growth over areas larger than 1×1 mm² on 0.2°-off 4H—SiC $(0001)_{Si}$ substrates can be obtained at a C/Si ratio of 1.6, whereas a C/Si ratio of 2 significantly increases the number of surface defects. It shall be noted that in this publication the area of homoepitaxial growth free of polytype inclusions and surface defects (1×1 mm²) is too small for acceptable device manufacturing yields. The density of surface defects (150 cm$^{-2}$ triangular defect and so-called carrot defects in their best sample) is also too high for acceptable device manufacturing yields.

In [1], Nakamura also teaches that homoepitaxial growth over areas larger than 1×1 mm² are realised on 0.7°-off 4H—SiC $(0001)_C$ substrates provided that the surface damage of the substrate is reduced prior to growth by thermal oxidation for 12 hours. The density of surface defects (150 cm$^{-2}$ triangular defect and so-called carrot defects in their epilayer grown on 0.7°-off 4H—SiC $(0001)_C$ substrate) is however too high for acceptable device manufacturing yields.

In other publications [2, 3], Nakamura et al. reports that homoepitaxial growth without 3 C inclusions over an area of 1 cm² can be realized on 6H—SiC $(000)_{Si}$ substrates with an off-angle of 0.3° towards [01$\bar{1}$0] if "the substrate is neatly prepared and the growth procedure is properly selected". The described growth procedure includes an HCl gas etching at 1300° C. for 10 min, growth at 1500° C. with a C/Si ratio not higher than 2 in an atmospheric pressure CVD system operating at 3.5 µm/h. To avoid a high density of triangular shaped defects, a gradual introduction of the silane precursor is recommended by the authors. The substrate preparation prior to growth is not described, but it is mentioned that the lowest density of defects is obtained on commercial as-received substrates. Improper oxidation or plasma treatments on as-received substrates increase the density of triangular shaped surface defects and 3 C-inclusions. This shows that the surface quality is a necessary requirement for wide-area homoepitaxial growth on low off-axis SiC substrates. It shall be noted that a specular epitaxial surface is obtained by the authors on only ~40% of the substrate area.

Hallin et al. [4] reports, in a CVD system operated at 1580° C. and a growth rate of 3 µm/h, that an almost 100% reproducible yield can be obtained for homoepitaxial growth of 30 µm thick layers when growing on the C-face of 4H (0001) on-axis substrates, whereas the inclusion free area is of the order of 50% when using Si-face on-axis substrates. It is also taught that the surface roughness of on-axis epilayers is too large and that inclusions begin to appear if a growth rate higher than 4 µm/h is used at 1580° C. It shall be noted that the homoepitaxial growth yields in this work refer to those obtained on 3 to 5 cm² large substrates, i.e on much smaller areas than full substrates of 2 inches and larger diameter (20 cm² and larger).

Treu et al [5] describes the material cost advantages of reducing the off-axis angle of 3-inch diameter 4H—SiC wafers angle from 8° to 4° and that by changing the C/Si ratio the step bunching appearing on 4° off-axis epilayers could be reduced. However, this affected negatively the background doping and the thickness and doping homogeneity. A modified process was developed to reduce step bunching on 4° off-axis wafers, while almost maintaining the other layer properties, but is not described in their publication.

Kojima et al [6] reported the development of CVD growth conditions suited for homoepitaxial growth on 8°-off 4H—SiC $(000)_C$ substrates. A first finding is that, as compared to epitaxy on Si-face substrates, a lower C/Si ratio and a 100° C. higher growth temperature are needed to obtain specular surfaces. A C/Si ratio lower than 1.5 (preferably 0.6) and a temperature of 1600° C. is needed to prevent the formation of triangular surface defects in epilayers grown on conventional off-axis angle C-face 4H substrates. A second finding is that degradation of the surface morphology under C/Si ratios higher than 0.6 can be avoided by first growing a 1 µm thick boundary layer at a C/Si of 0.6 and then continue the CVD growth at a higher C/Si ratio optimized for e.g. the doping of the active epilayers.

In another publication, Kojima [7] teaches that, much smoother epitaxial surfaces can be obtained on the C-face than on the Si-face of on-axis 4H substrates. After hydrogen etching at 1600° C., Si-face on-axis substrates already exhibit a more step-bunched surface than C-face on-axis substrates. Rough surface morphologies are obtained for both Si- and C-face (0001) substrates under C-rich growth conditions (C/Si=1.6). Under Si-rich growth conditions (C/Si=0.6), a surface specular under optical microscope examination is obtained for C-face (0001) substrates, while the surface remains rough for Si-face on-axis substrates. The authors demonstrate homoepitaxial growth of a 10 µm layer grown at ~2 um/h using a 2 inches 4H—SiC $(0001)_C$ substrate described as on-axis and obtained a specular surface on 80% of the wafer area.

This result is very promising for the SiC field as it provides a possibility to use true on-axis wafers for SiC devices, provided several device processing steps, such as oxidation, etching, Schottky and ohmic contacts can be adjusted to the use of the C-face instead of the current Si-face standard.

As illustrated by the presence of several triangular shaped foreign polytype inclusions in FIG. 1, it was however found by the authors of this application that the results report in [7] do not tend to be systematically reproducible. This was especially found to be the case if a C/Si higher than 0.6 is used for doping uniformity purposes, as was the case in the experiment carried out and illustrated in FIG. 1. Besides the limitation introduced by the need of a low C/Si (0.6 in [7]), a main limitation of so-called on-axis substrates, which has not been found to be described in the prior art, is that true on-axis substrates are very difficult to produce reliably in practice. For illustrative purposes, an on-axis substrate will here be defined, however without any restrictive limitation on the specific values given as examples, as a substrate which surfaces are oriented parallel to the (0001) basal plane with an angle less than ±0.05 degree over a substantial (e.g 95%) area of the substrate. In practice, the tolerances of the ingot mounting in the slicing step, of the substrates mounting in the polishing steps and the possible bending of the (0001) crystallographic planes within the crystal, make a reproducible fabrication on true on-axis substrates quite difficult. The authors of [7] indicate that the off-angle of the "on-axis" 4H—SiC $(0001)_C$ substrate used in their study was estimated, in the center of the substrate, to be 0.5° by X-ray diffraction (XRD). The implications of this value on the homoepitaxial process and its importance on the presented results are however not elaborated upon or recognised in their publication.

The two dimensional off-axis angle map of a 2 inches on-axis substrate clearly (FIG. 2) illustrates that quite large variations of the off-axis exist within an "on-axis" substrate (e.g. from 0.15 to 0.9 degree in FIG. 2). Due to the inherent tolerances of slicing, polishing and possible presence of crystal bending, which tend to increase with increasing substrate diameter, on-axis substrates will tend to have a region being off-axis less than 0.1 degree and other regions being off-axis more than 0.5 degree. Substrates from different crystals will tend to have a different average off-axis. The non reproducibility of the polytype yield between FIG. 1 and the results presented in [7] is partly assigned in the average off-axis angles difference between the substrates used in FIG. 1 and [7]. Therefore, there is a need to provide substrates with a reproducible orientation and combining the need of minimized material losses during slicing and the presence of technological tolerances in their fabrication process.

Discovered in 2000 [8], the degradation of the forward characteristic of a significant percentage of bipolar SiC devices under reliability testing, constitutes, until it will be solved, a significant obstacle to the introduction of SiC device in high power systems. It has rapidly been established [8, 9] that the degradation of SiC bipolar devices is due to the generation of planar structural defects known as Shockley type stacking faults caused by an electron-hole recombination activated glide of partial dislocations along the (0001) basal plane traversing the device's drift layer. As basal plane dislocations (BPDs) in the active region of the bipolar devices act as a nucleation site for these stacking faults, it is necessary to drastically reduce the density of BPDs. Two potential sources of basal plane dislocations leading to stacking faults expansion under forward bias in the drift layer of a bipolar device have been identified. The first one originates from threading edge dislocations present in the substrate with a burger vector along [11$\bar{2}$0] which are deflected at the epi-substrate interface into two partial dislocations lying in the (0001) basal plane. The second one are basal plane dislocations present in the substrate and replicated into the epilayer. The work of Ha et al. [10] showed that only about 5% of the BPDs present in 8° off-axis substrate are replicated as such in the epilayer while most are converted into threading edge dislocations. Provided that threading edge dislocations do not act as nucleation sites for stacking faults, this result is encouraging but still requires a further reduction of BPDs propagating into the epilayer.

SUMMARY OF THE INVENTION

In a first aspect of the invention the off-axis angle at which SiC substrates are sliced from an SiC ingot is reduced to a value below 1 degree from the current 4 to 8 degrees. This implies a decrease of the contribution of the crystal growth cost to the overall device cost. A further result of the first aspect of the invention is the achievement of a reduction of BPDs propagating into epilayers grown upon SiC substrates by a reduction of the amount of BPDs intersecting the surface of the substrate by a decrease of the off-axis angle at which the substrate is cut. For example, a reduction of the off-axis angle from 8 to 0.8 degrees, geometrically translates into a factor 10 reduction of the BPDs emerging per unit area at the surface of the substrate.

In a second aspect of the invention homoepitaxially layers of SiC polytypes are grown with very low defect density on SiC substrates having an off-axis less than 1 degree by starting the epitaxial growth with a boundary layer, see FIG. 10, grown with a low growth rate.

In a third aspect of the invention, a buffer layer is grown between a substrate and the drift layer in a manner such that the thickness of the buffer layer is adjusted to the off-axis angle of the substrate and the area of the device. This measure provides to prevent multiplication of stacking faults by preventing the glide of any partial dislocation bounding the stacking fault to the substrate epi interface. It is an advantage if the buffer layer is containing a boundary layer at the buffer interface towards the substrate, even if it is not a requirement for the buffer to serve its purpose.

Further, the third aspect of the invention provides that the lifetime of minority carriers within the buffer layer is intentionally decreased to reduce the propagation length of SFs (Stacking Faults) in the buffer layer.

Still further, according to the third aspect of the present invention it is provided a buffer layer, the thickness of which is not chosen according to the diffusion length of the minority carriers, but is instead chosen according to the off-axis angle of the substrate upon which a bipolar device structure can be grown. In particular, the boundary layer is, for a given off-axis angle and for a given width of a device contact along the off-axis direction, made sufficiently thick so that any basal plane defect present in the drift layer of the device does not intersect the substrate/epi interface within the contact area of the device (FIG. 8) and thereby does not reach the substrate/epi interface where sources for SFs multiplication are expected to be present at higher density.

BRIEF DESCRIPTION OF THE DRAWINGS

The patent or application file contains at least one drawing executed in color. Copies of this patent or patent application publication with color drawings will be provided by the Office upon request and payment of the necessary fee.

The upper figure corresponds to the prior art, where the stacking fault SF can propagate from the drift layer down to intersect the substrate/boundary layer interface at location 1 under the active area of the device (grey region).

The lower figure shows, according to an embodiment of the invention, that when the thickness of the buffer layer is correctly adjusted to the off-axis angle of the substrate, any stacking fault which can propagate from the drift layer down to the substrate/buffer layer interface intersects this interface outside the active region of the device (open circles).

Figure 9:
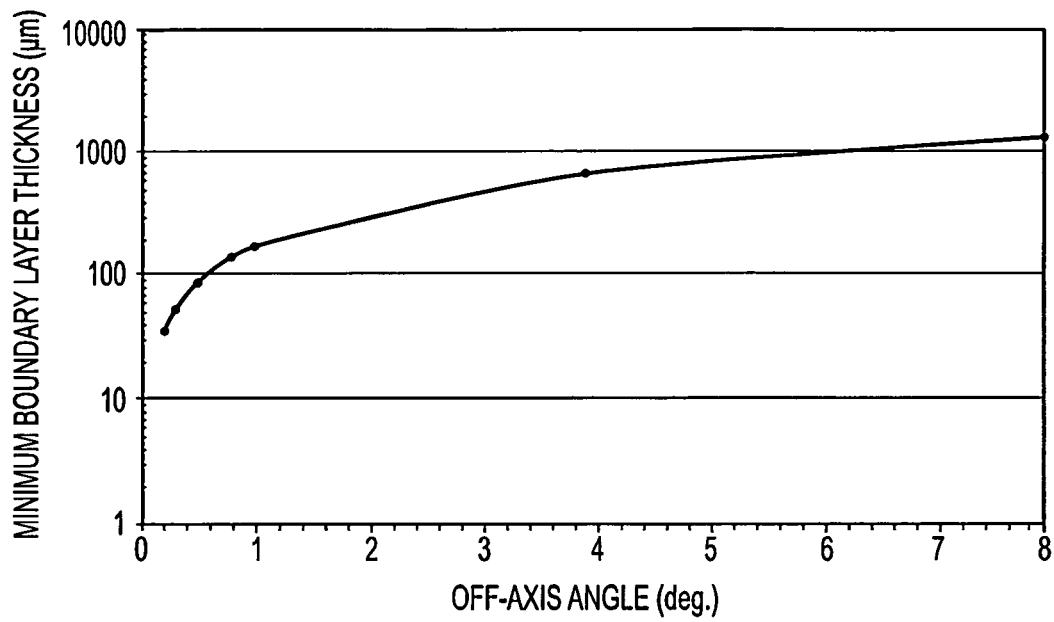

FIG. 9 illustrates the minimum thickness of the buffer layer required for the third embodiment of the invention in the case of a 1 cm wide power device versus the off-axis angel of the substrate upon which the epitaxial bipolar structure is grown.

Figure 10:
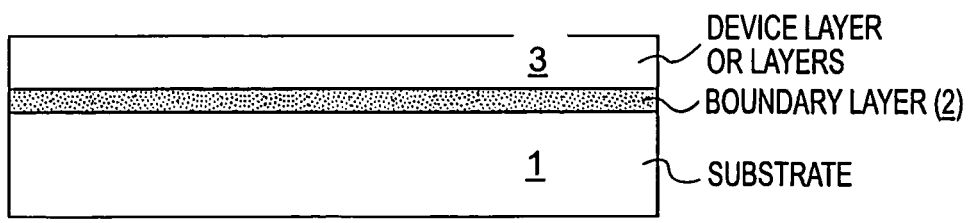

FIG. 10 is a cross section of a wafer showing the boundary layer between the substrate and the device layer(s).

DETAILED DESCRIPTION OF THE INVENTION

Figure 1:
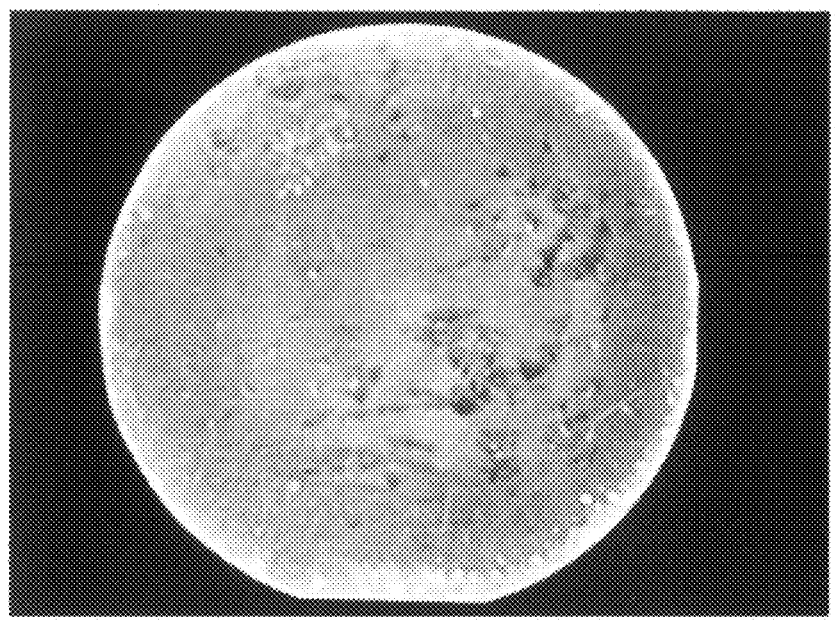
FIG. 1 is a view under UV light illumination of an on-axis 4H—SiC (0001) C-face wafer cooled to 77K comprising a 7 µm thick n-type epitaxial layer. The black triangular features correspond to foreign polytype inclusions created during the epitaxial growth process.
Figure 2:
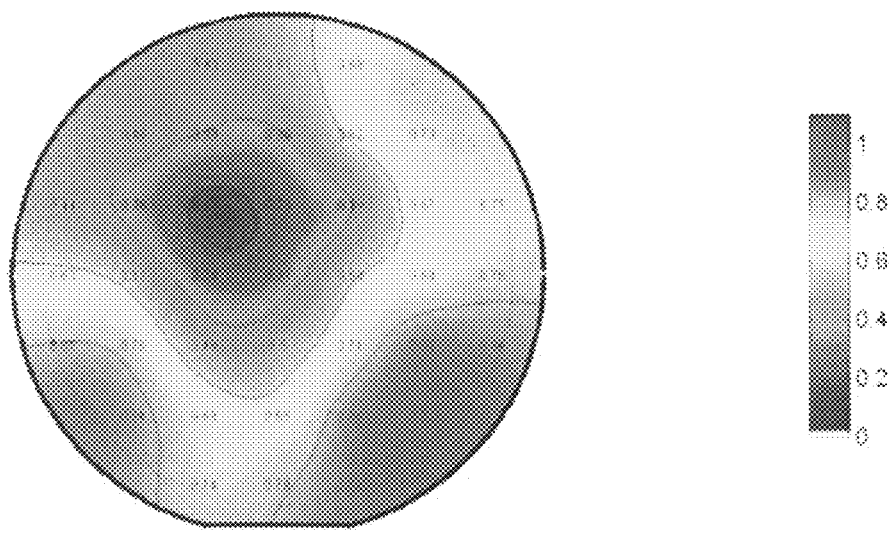
FIG. 2 is a map of the off-axis measured on a on-axis 4H—SiC (0001) C-face substrate by high resolution X-ray diffraction, where the off-axis angle is the sum of the absolute value of the off-axis angle measured along the [11$\bar{2}$0] and the [1$\bar{1}$00] directions.
Figure 3:
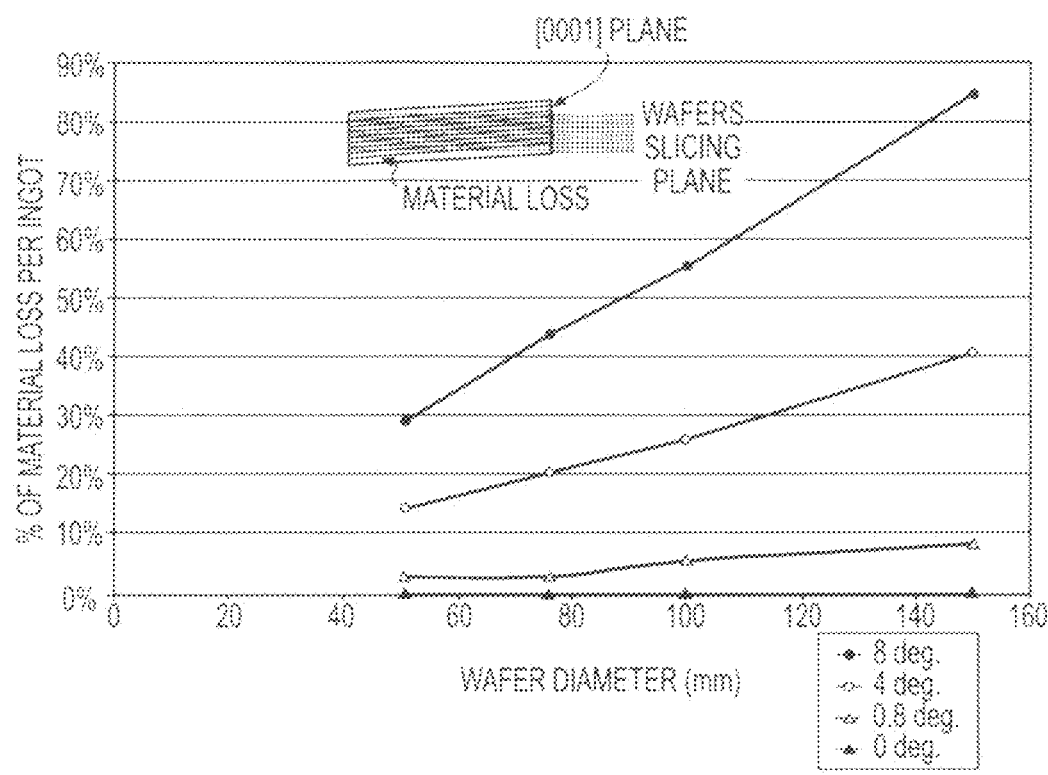
FIG. 3 illustrates the percentage of material lost (not taking into account the slicing kerf loss) when a 25 mm thick on-axis grown SiC ingot is sliced at off-axis angles ranging from 8 to 0 degrees for ingot diameters ranging from 2 to 6 inches.

FIG. 3 illustrates the reduction of the material loss achieved by the invention in the case of a 25 mm long SiC ingot. Typical off-axis angles are presently 8 to 4 degrees for 2 inches and 3 inches diameter substrates, respectively. A first feature of the invention is a reduction of the off-axis angle to a value below 1 degree (e.g. 0.8 degree). Thereby, the material loss is reduced from 30 to 40% to less than 3%, respectively. The advantage of the invention become pronounced for larger diameters: in the case of 4 inches and 6 inches substrates sliced at 0.8 instead of 4 degrees, the material loss is reduced from 26 to 6% and from 41 to 9%, respectively.

The advantage of low off-axis slicing can however not be exploited in SiC devices unless homoepitaxial layers with defects densities comparable to the present state of the art can be produced. In view of the prior art, appropriate in-situ CVD etching techniques involving hydrogen and/or HCl, in combination with a growth start using a low C/Si ratio boundary layer appear as appropriate to achieve the desired result. The use of low C/Si ratios has however the disadvantage of affecting other properties of the layer, in particular its doping and the thickness uniformity. In certain cases, such as in e.g. a MESFET device structure, the thickness and doping uniformity of a moderately doped (approximately $10^{15}$ to $5 \times 10^{17}$ cm$^{-3}$) p-type layer are essential for the performances of the device, but will tend to be adversely affected by a low C/Si ratio growth.

To overcome said limitation, the present invention proposes, as a second feature of the invention, the use of a boundary layer 2 grown at a C/Si ratio optimized for high thickness and doping uniformity, but with a sufficiently lower supersaturation than with the following device layers 3 to ensure that the epitaxial layers meets the polytype, surface defects and roughness requirements of the device. The lower supersaturation may be achieved by using, at constant growth temperature, a lower growth rate e.g. with reduced silicon and carbon precursors gas flow rates, or by the use of a higher growth temperature, or by other means suitable to the specific thin film growth process. The boundary layer 2 can be n-type doped, not limited to but preferably above $1 \times 10^{17}$ cm$^{-3}$. The layer can also if needed depending on targeted device structure be made p-type doped or high resistivity by introduction of intrinsic defects or doping by transition metals. This makes it possible to have the boundary layer 2 as a part of the substrate 1 or the epitaxial device structure from an electrical (resistivity) point of view. It can also be made as an additional layer separated from the substrate 1 and the device layer(s) 3.

Figure 4:
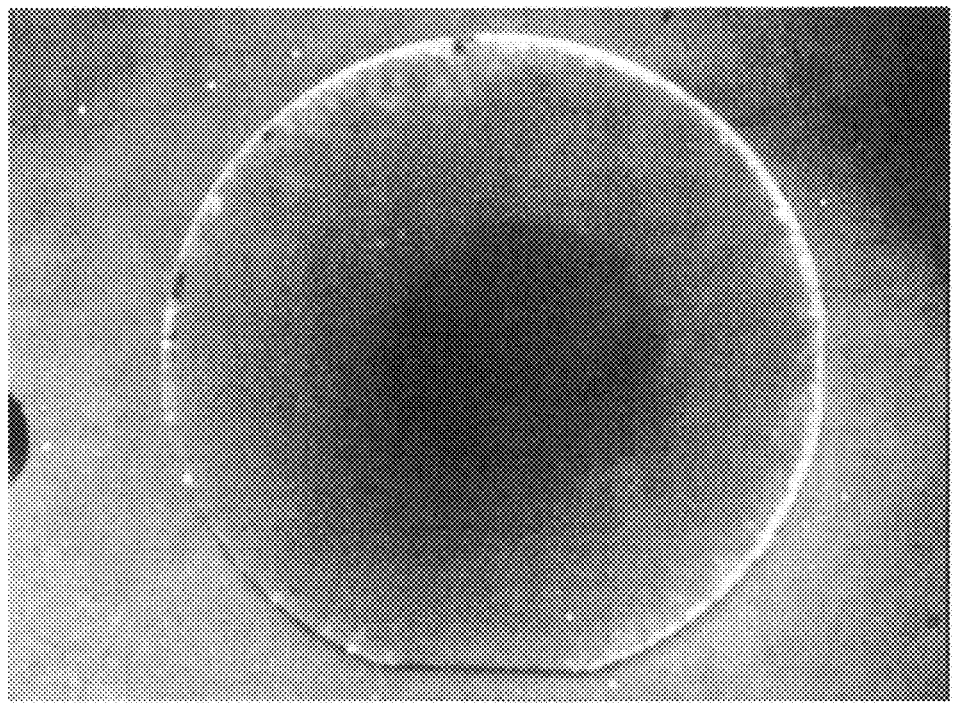
FIG. 4 is a view under UV light illumination of a 2 inch diameter 0.8° off-axis 4H—SiC (0001) C-face wafer cooled to 77K comprising a 7 µm thick n-type epitaxial layer grown according to the second embodiment of the invention. The circular darker feature in the centre of the wafer corresponds to the nitrogen doping facet introduced in the n-type underlying substrate by the crystal growth process.
Figure 5:
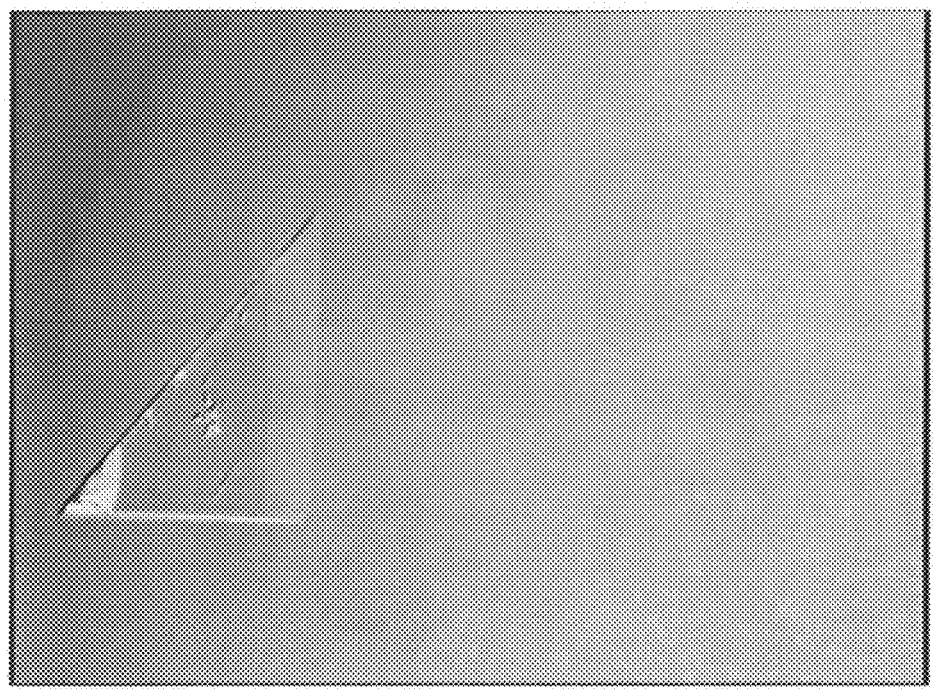
FIG. 5 depicts the surface morphology under 50 times magnification of a Nomarski differential interference contrast microscope of the 7 µm thick epilayer grown on a n-type 0.8° off-axis 4H—SiC (0001) C-face wafer according to the second embodiment of the invention. The triangular defect on the left side of the picture is typical for this epilayer.
Figure 6:
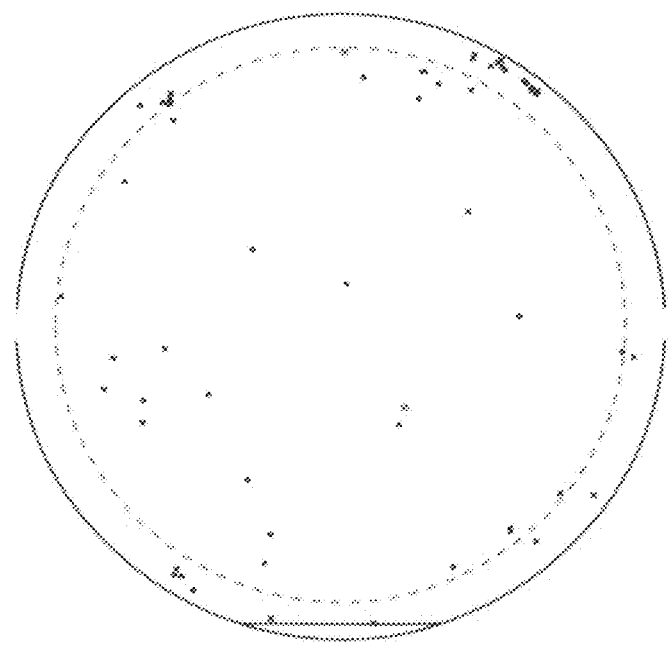
FIG. 6 is a map of the triangular defects (black squares) of the 7 µm thick epilayer of the wafer of FIG. 5. The density of triangular defects is of 1.8 cm$^{-2}$ over the 2 inches wafer.

According to this second feature, a typical 7 µm thick n-type Schottky diode structure was grown on a full CMP polished 0.8° off-axis 2 inches 4H—SiC (0001)$_C$ substrate where the growth was initiated after a gradual 3 minutes ramp of the Si- and C-gas precursors, and where the first 0.5 µm of the epitaxial structure was grown at a growth rate of 1 µm/h, with a C/Si ratio of 1.2. The UV polytype map of FIG. 4 confirms the excellent replication of the 4H polytype in the epilayer with a >95% yield over the entire wafer. The surface roughness of the epilayer is equivalent to the one of conventional 8° or 4° off-axis 4H—SiC $(000)_{Si}$ substrates with measured RMS values of 3 to 5 nm. Epi surface defects known in the 8° or 4° off-axis prior art, such as carrots, comets, half moons etc. did not appear in this epilayer. Instead, the only surface defects detected were equilateral or isosceles shaped triangles as illustrated in FIG. 5. The defect maps of FIG. 6, however, shows that the density of these surface defects is very low (<2 cm$^{-2}$ in this experiment), a value two orders of magnitude lower than the prior art of reference [1], which illustrates the advantage of the present invention.

Figure 7:
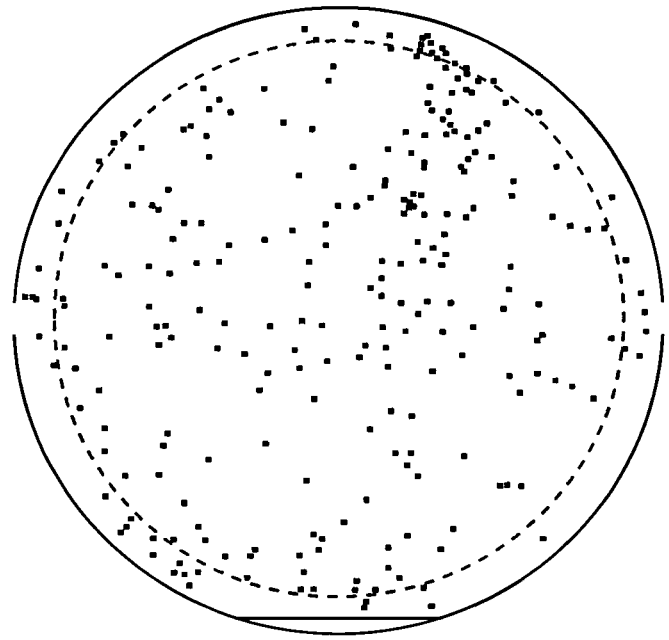
FIG. 7 is a map of the triangular defects (black squares) of a 7 µm thick epilayer grown on a n-type 0.8° off-axis 4H—SiC (0001) C-face wafer with an initial growth rate for the first 0.5 µm larger than 3 µm/h at a growth temperature of 1600° C. The density of triangular defects is of 12.3 cm$^{-2}$ over the 2 inches wafer.

To confirm the influence of the growth rate at the initial stage of the epitaxial growth process, a second experiment using a CMP polished 0.8° off-axis 2 inches 4H—SiC $(0001)_C$ substrate from the same ingot, but where the first 0.5 µm of the epitaxial structure was grown at higher Si- and C-precursor flow rates to obtain a growth rate of 3.5 µm/h, all other CVD process parameters being equal. The surface roughness of the resulting 7 µm thick n-type layers was equivalent to the one of the lower growth rate boundary layer. However, as shown in FIG. 7, the density of triangular shaped surface defects increased to 12 cm$^{-2}$. This indicates that a higher defect density is obtained at C/Si ratios higher than 1 in absence of a boundary layer grown at low supersaturation.

A similar, however more pronounced effect, has been obtained by the authors of the present invention when epitaxial growth is performed on 0.8° off-axis 2 inches 4H—SiC $(0001)_{Si}$ substrates 1. When the first 0.5 µm of 7 µm thick n-type layers were grown at growth rates higher than 3 to 4 µm/h, the 4H polytype yield was lower than 50%, whereas it was higher than 80% when the growth rate of the boundary layer 2 was less than 1.5 µm/h.

It was also observed that the surface roughness of 7 µm thick epitaxial layers grown on Si-face 4H substrates was somewhat higher than for C-face substrates loaded in the same CVD run. Further experiments showed that, the origin of this increased roughness results from a step bunching appearing on the surface of Si-face substrate during the heating stage of the CVD process, where the substrate temperature is increased from room temperature to ca. 1600° C. in presence of the hydrogen carrier gas. In order to overcome this surface degradation, the present invention further proposes to a) reduce the heating time to less than 30 min, b) above 1420° C., to ramp with the temperature a Si-precursor flow scaled to 10 to 90% of the Si partial pressure above the substrate 1 surface. This procedure may be completed with a temperature ramp of the C-precursor flow rate in order to maintain a constant C/Si ratio and will slow down the etching of the surface of the substrate 1, thereby reducing the step bunching prior to growth on Si-face 4H—SiC substrates.

A further feature of the present invention addresses the degradation phenomena in bipolar SiC devices. The prior art taught by the patent application publication US 2003/0080842 A1 (further on designated as '80842) teaches that, in order to minimize degradation of bipolar SiC devices, a buffer layer between the substrate and the low doped drift layer shall be used, the thickness of the buffer layer being chosen so that it exceeds the diffusion length of minority carriers. As an example, a 2 µm thick n+ buffer layer with a carrier concentration of about 2×10$^{18}$ cm$^{-3}$ is given for a pin structure comprising a 45 µm n− drift layer.

This example is however in the opinion of the authors of the present invention not correct. The experimental experience shows that the diffusion length of holes in a nitrogen doped buffer layer is equivalent to the diffusion length in the drift layer, because the buffer layer's nitrogen doping alone does not reduce the minority carrier lifetime. Thus buffer layers of the order of 45 µm would be needed to practice correctly '80842. The teaching of '80842, in view of the experience of the authors of the present invention, also means that for high voltage SiC device ($\geq$10 kV blocking voltage), buffer layers of the order of 100 µm would be needed. The approach of '80842 thus may prohibitively increase the share of the epitaxy process in the device cost structure.

Figure 8:
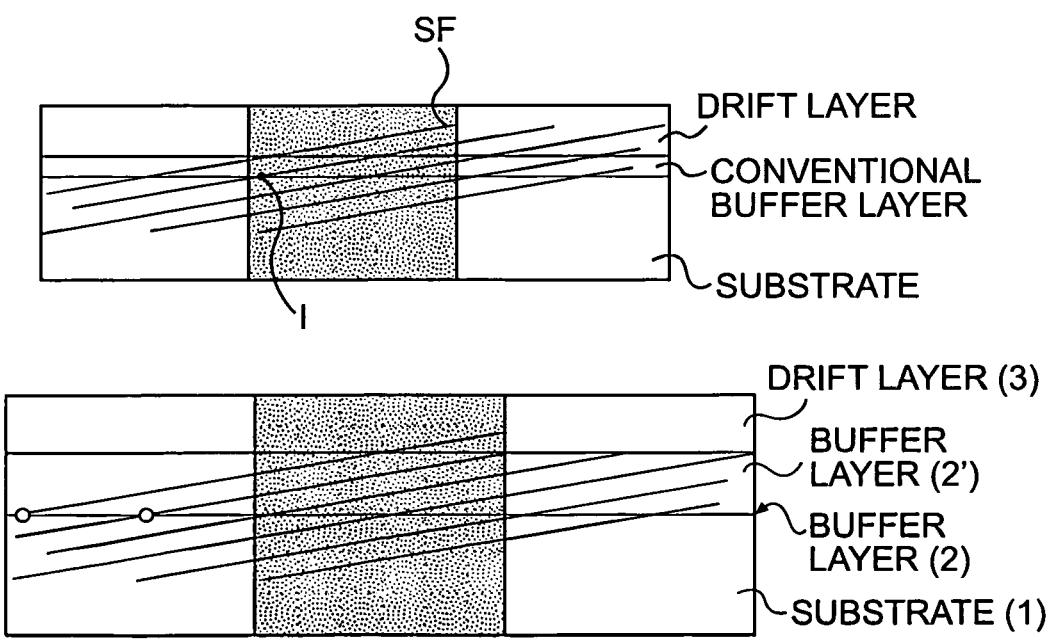
FIG. 8 is a cross section of a part of a bipolar device epitaxial structure comprising a substrate, a buffer layer including a boundary layer and a low doped drift layer.

To overcome this limitation, according to a further feature of the present invention, it is proposed to use a buffer layer 2', the thickness of which is not chosen according to the diffusion length of the minority carriers, but is instead chosen according to the off-axis angle of the substrate 1 upon which the bipolar device structure is grown. In particular, the buffer layer 2' is, for a given off-axis angle and for a given width of the device contact along the off-axis direction, made sufficiently thick so that any basal plane defect present in the drift layer 3 of the device does not intersect the substrate/epi interface within the contact area of the device (FIG. 8) and thereby does not reach the substrate/epi interface where sources for SFs multiplication are expected to be present at higher density. For a typical 1×1 cm$^2$ large power device, with a width W along the off-axis direction (e.g. [11$\bar{2}$0]), the minimum thickness $t_{min}$ of the buffer layer 2' can be calculated from the off-axis angle α by:

$$t_{min}=\tan(\alpha)\times W$$

As shown in FIG. 9, for substrates with conventional off-axis angles above 4° this approach is unrealistic due to minimum thicknesses above 500 µm. However, for off-axis angle of the order of 0.3 degrees, the minimum thickness of the buffer layer is 50 µm or less for a 1 cm wide power device, which is half of the value of the estimated diffusion length of the minority carriers in a 10 kV device. It is also obvious that it becomes advantageous to use rectangular rather than square shaped contacts for a bipolar device grown on this substrate to reduce the width of the device along the off-axis direction and thus the required minimum thickness, as well as the influence per unit surface area of any stacking fault propagating in to the drift layer (as the SF propagates extends along the off-axis direction).

According to still a further feature of the present invention, it is proposed to intentionally reduce the minority carrier lifetime in the buffer layer 2' and thus the possibility of stacking faults to propagate to remaining sources of SFs multiplication within the buffer layer 2' by addition of either deep impurities in addition to the n- or p-type doping of the buffer layer 2', or alternatively by introducing intrinsic defects during epitaxial growth, or alternatively by introducing intrinsic defects acting as recombination centers by electron or proton irradiation of the buffer layer 2'.

The teachings of the present invention can be applied to SiC substrates 1 prepared off-axis along other planes than the (0001) plane, e.g. the {11-20} and {1-100} family planes or planes inclined between the a- and c-axis of the crystal such as the {03-38} planes of the 4H polytype. The off-axis direction could be chosen along: between one of the equivalent <11$\bar{2}$0> directions and one of the 6 equivalent <01$\bar{1}$0> directions. The off-axis direction could be within the (0001) plane, at an angle between 10 and 20 degrees of one the equivalent <11$\bar{2}$0> directions. The off-axis angle could be between 0.1 and 0.4 degrees along either the <11$\bar{2}$0> or the <01$\bar{1}$0> or any direction between said directions.

The teachings of the present invention can be applied to other semiconductor materials having more than one polytype crystallographic structure such as GaN where the 2H hexagonal and the cubic 3 C polytype can be formed.

The epitaxial growth is performed using a Chemical Vapor Deposition (CVD) method using hydrogen ($H_2$) as carrier gas and silane ($SiH_4$) and a hydrocarbon gas such as ethylene ($C_2H_4$) as Si and C precursors. The CVD method is preferentially carried out in a so-called hot-wall reactor, where the wall facing the growth surface of the substrate 1 is heated to the same temperature range as the substrate 1. The radial and axial temperature uniformity may be optimized to avoid nucleation of foreign polytype inclusions. The method uses preferentially a substrate temperature above 1500° C. and a reduced pressure, typically less than 250 mbar, which has the advantage of contributing to minimize the supersaturation. The so-called input C to Si ratio, the ratio of the C and Si containing precursors, is typically chosen to be less than 1.5 in the method practiced in this invention.

Other Si precursors than silane may also be used such as chlorosilanes, e.g. SiH2Cl2 or SiCl4, or methylsilanes. The advantage of halogen containing precursors in respect of this invention is the well-known Si supersaturation lowering effect introduced by HCl gases. Other C precursors than ethylene may be used without loosing the teaching of the invention, e.g. methane or propane.

A wafer produced with a method according to the present invention may be used for heteroepitaxial growth of nitride layers, such as AlN or GaN and their alloys, or oxide layers such as ZnO, on a surface of said wafer and inclined relative to the (0001) basal plane at an angle higher than 0.1 degree but less than 1 degree. The nitride layers may be AlN or GaN and their alloys and the oxide layers may be ZnO.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto, in which claims any reference signs shall not be construed as limiting the scope of the claims.

REFERENCES OF THE PRIOR ART

[1] "Surface mechanisms in homoepitaxial growth on α-SiC {0001}-vicinal faces", S. Nakamura, T. Kimoto and H. Matsunami, Materials Science Forums Vols. 457-460 (2004), pp. 163-168
[2] "Wide area homoepitaxial growth of 6H—SiC on nearly on-axis (0001) by chemical vapour deposition", S. Nakamura, T. Kimoto and H. Matsunami, Materials Science Forums Vols. 433-436 (2003), pp. 149-152
[3] "Homoepitaxy of 6H—SiC on nearly on-axis (0001) faces by chemical vapour deposition, Part 1: Effect of C/Si ratio on wide-area homoepitaxy without 3C—SiC inclusions", S. Nakamura, T. Kimoto and H. Matsunami, J. of Crystal Growth 256 (2003), p. 341-346
[4] "Homoepitaxial on-axis growth of 4H- and 6H—SiC by CVD", C. Hallin, Q. Wahab, I. Ivanov, P. Bergman and E. Janzén, Materials Science Forums Vols. 457-460 (2004), pp. 193-196
[5] "Challenges and first results of SiC Schottky diode manufacturing using a 3 inch technology", M. Treu, R. Rupp, H. Brunner, F. Dahlquist and C. Hecht, Materials Science Forums Vols. 457-460 (2004), pp. 981-984
[6] "4H—SiC carbon face epitaxial layers grown by low-pressure hot-wall chemical deposition" K. Kojma, T. Takahashi, Y. Ishida, S. Kuroda, H. Oknumra and K. Arai, Materials Science Forums Vols. 457-460 (2004), pp. 209-212
[7] "Homoepitaxial growth of 4H SiC on on-axis (0001) C-face substrates by chemical vapor deposition", K. Kojima, H. Okumura, S. Kuroda and K. Arai, J. Crystal Growth, available on-line 17-06-2004 www.sciencedirect.com

The invention claimed is:

1. An SiC wafer produced according to a method comprising:
    growing SiC homoepitaxial layers on a surface of an SiC substrate, wherein the layers have a same polytype as the substrate, and wherein the surface is inclined relative to a (0001) basal plane at an angle higher than 0.1 degree but less than 1 degree;
    starting an homoepitaxial growth by forming a boundary layer with a thickness up to 1 μm; and
    forming a homoepitaxial device layer wherein the boundary layer is formed in an atmosphere of lower supersaturation than when forming the homoepitaxial device layer and at a C/Si ratio above 1, such that the homoepitaxial device layer has a density of surface defects that is less than 2 $cm^{-2}$.

2. The SiC wafer according to claim 1, wherein an off-axis angle is between 0.1 and 0.4 degrees along either a <11$\bar{2}$0> direction or a <01$\bar{1}$0> direction or any direction between said directions.

3. The SiC wafer according to claim 1, wherein a width of the device structure along an off-axis direction is smaller than the length of the device structure along a direction perpendicular to the off-axis direction.

4. The SiC wafer according to claim 1, wherein in boundary layer minority carriers have been reduced by an introduction during epitaxial growth, or after epitaxial growth, of deep levels acting as lifetime killers using either transition metals doping, or intrinsic in-grown defects or ex-situ generated intrinsic defects by electron or proton irradiation techniques.

5. A wafer, comprising:
    a SiC substrate having a surface that is inclined relative to a (0001) basal plane at an angle higher than 0.1 degree but less than 1 degree;
    a SiC homoepitaxial device layer; and
    a SiC homoepitaxial boundary layer having a thickness up to 1 μm arranged between the substrate and the device layer, wherein the boundary layer has been grown on the substrate under an atmosphere of lower supersaturation than when forming the device layer and at a C/Si ratio above 1, wherein the homoepitaxial device layer has a density of surface defects that is less than 2 $cm^{-2}$.

6. The wafer according to claim 5, wherein an off-axis direction is chosen along any one from the group of:
    one of the 6 equivalent <11$\bar{2}$0> directions, or
    one of the 6 equivalent <01$\bar{1}$0> directions.

7. The wafer according to claim 5, wherein an off-axis is chosen along: between one of the equivalent <11$\bar{2}$0> directions and one of the 6 equivalent <01$\bar{1}$0> directions.

8. The wafer according to claim 7, wherein the off-axis direction is within the (0001) plane at an angle between 10 and 20 degrees of one of the equivalent <11$\bar{2}$0> directions.

9. The wafer according to claim 5, further comprising:
- an epitaxied bipolar device structure comprising a low doped drift layer; and
- a buffer layer between the boundary layer and the low doped drift layer, wherein a thickness of the buffer layer is at least equal to the tangent of the off-axis angle between the wafer surface and the (0001) basal plane times the width of the device along an off-axis direction.

10. The wafer according to claim 9, wherein the off-axis angle is between 0.1 and 0.4 degrees along either the <11$\bar{2}$0> or the <01$\bar{1}$0> or any direction between the directions, and wherein the thickness of the buffer layer is greater than 16 microns.

11. The wafer according to claim 9, wherein the width of the device structure along the off-axis direction is smaller than the length of the device structure along the direction perpendicular to the off-axis direction.

12. An SiC wafer, comprising:
- an Sic substrate;
- SiC homoepitaxial layers on a surface of the SiC substrate, wherein the layers have a same polytype as the substrate, and wherein the surface of the substrate is inclined relative to a (0001) basal plane at an angle higher than 0.1 degree but less than 1 degree;
- a boundary layer having a thickness up to 1 μm; and
- a homoepitaxial device layer having a density of surface defects that is less than 2 $cm^{-2}$.

* * * * *